(12) United States Patent
Schaefer

(10) Patent No.: US 8,959,271 B2
(45) Date of Patent: Feb. 17, 2015

(54) SYSTEM AND METHOD FOR ACCESSING MEMORY

(71) Applicant: Intel Corporation, Santa Clara, CA (US)

(72) Inventor: Andre Schaefer, Braunschweig (DE)

(73) Assignee: Intel Corporation, Santa Clara (*) Notice: Subject to any disclaimer, the term of this patent is extended or adjusted under 35 U.S.C. 154(b) by 0 days.

(21) Appl. No.: 13/835,864

(22) Filed: Mar. 15, 2013

(65) Prior Publication Data

US 2014/0281193 A1   Sep. 18, 2014

(51) Int. Cl.
*G06F 13/14* (2006.01)
*G06F 12/00* (2006.01)
*G06F 13/00* (2006.01)
*G06F 13/28* (2006.01)
*G11C 7/10* (2006.01)

(52) U.S. Cl.
CPC .................................. *G11C 7/1072* (2013.01)
USPC ........................... 710/305; 711/105; 711/167

(58) Field of Classification Search
USPC ........................ 711/105, 2, 167; 710/6, 305
See application file for complete search history.

(56) References Cited

U.S. PATENT DOCUMENTS

| 6,195,724 | B1 * | 2/2001 | Stracovsky et al. | 710/244 |
| 2006/0136618 | A1 * | 6/2006 | Gower et al. | 710/52 |
| 2010/0005217 | A1 * | 1/2010 | Jeddeloh | 711/1 |
| 2011/0242908 | A1 * | 10/2011 | Park | 365/193 |

* cited by examiner

*Primary Examiner* — Farley Abad
(74) *Attorney, Agent, or Firm* — Chapin IP Law, LLC

(57) ABSTRACT

A close proximity memory arrangement maintains a point to point association between DQs, or data lines, to DRAM modules employs a clockless state machine on a DRAM side of the memory controller-DRAM interface such that a single FIFO on the memory controller side synchronizes or orders the DRAM fetch results. Addition of a row address (ROW-ADD) and column address (COL-ADD) strobe reducing latency and power demands. Close proximity point to point DRAM interfaces render the DRAM side FIFO redundant in interfaces such as direct stacked 3D DRAMs on top of the logic die hosting the memory controller. The close proximity point to point arrangement eliminates the DRAM internal FIFO and latency scheme, resulting in just the memory controller internal clock domain crossing FIFOs.

18 Claims, 4 Drawing Sheets ly increases depending on the fetched location in the
SYSTEM AND METHOD FOR ACCESSING MEMORY

BACKGROUND

A host computer system often communicates with computer memory such as DRAMs (Dynamic Random Access Memory) via a memory controller that issues commands to DRAM modules. In a typical memory controller, the commands indicate the memory location to be read or written, and are synchronized by a clock at the memory controller. Another clocking scheme at the DRAM orders the retrievals and also maintains the values in the DRAM, as non-volatile memory such as DRAM relies on consistent signals (i.e. voltage) to maintain the values (bits) in memory.

Conventional memory accesses travel via electrical signals between the memory controller and the DRAM modules, typically via a connection called a bus. Due to the high speed of these accesses, resulting from a clock speed of the memory controller and the bus nature of the link connecting memory controller and multiple DRAMs, individual DRAM results are queued and retimed to account for latency requirements between the commands to different DRAMs and the corresponding results (fetched data) to prevent data congestion at the bus. Such queues, or FIFOs (First-In-First-Out), order the results to maintain synchronization and timing between the commands requesting memory and the corresponding results of fetched memory values on DRAM component level

BRIEF DESCRIPTION OF THE DRAWINGS

The foregoing and other features will be apparent from the following description of particular embodiments disclosed herein, as illustrated in the accompanying drawings in which like reference characters refer to the same parts throughout the different views. The drawings are not necessarily to scale, emphasis instead being placed upon illustrating the principles of the invention.

DETAILED DESCRIPTION

Figure 1:
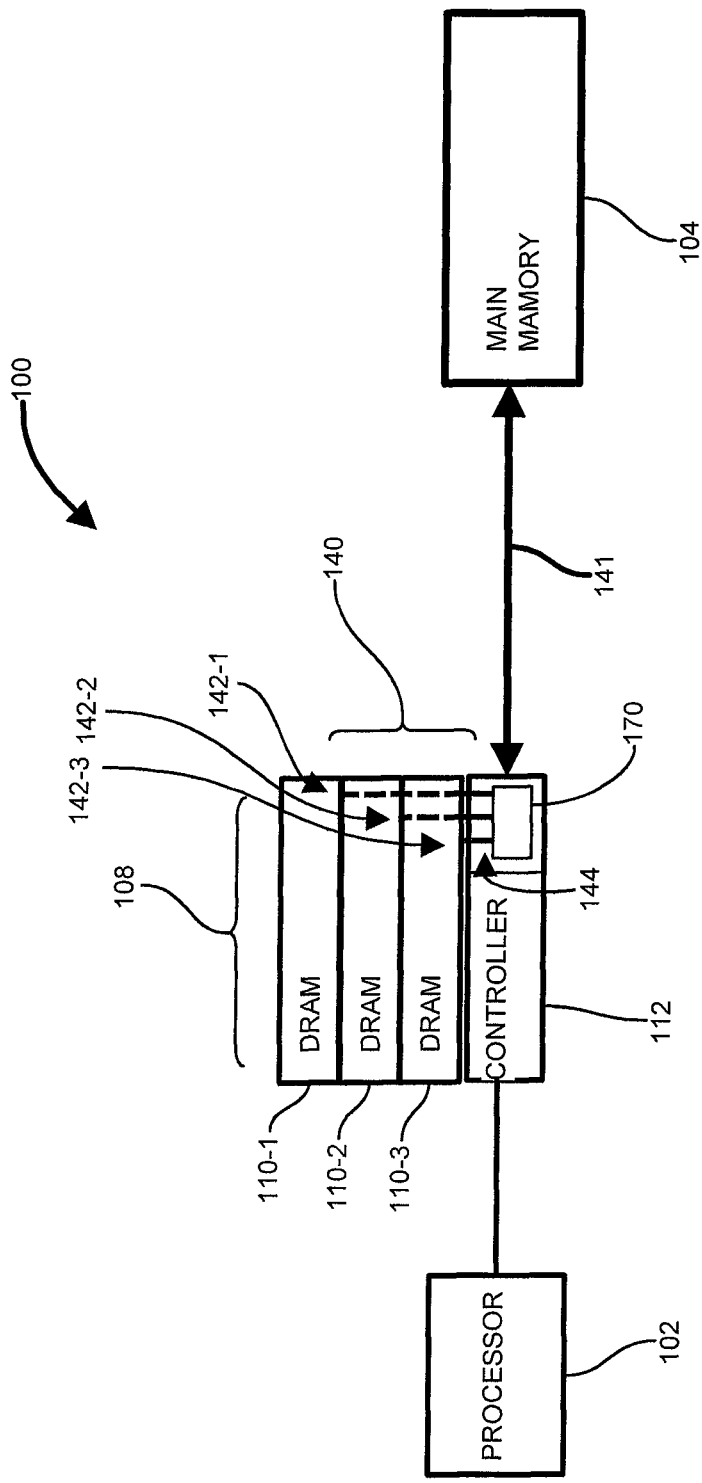
FIG. 1 is a context diagram of a computing environment suitable for use with configurations herein.

A close proximity memory arrangement maintains a point to point association between DQs, or data lines, to DRAM modules employs a clockless state machine on a DRAM side of the memory controller-DRAM interface such that a single FIFO on the memory controller side synchronizes or orders the DRAM fetch results. The point to point nature of the DQ link avoids the need for a FIFO on the DRAM side of the interface, reducing latency and power demands. Separation of the row address (ROW-ADD) and column address bus and application of separate ROW and column (COL) strobes instead of free-running clocks enable a low power, low latency DRAM-sided state machine design. Point to point DRAM interfaces render the DRAM-sided FIFO redundant in interfaces such as direct s 3-Dimensional (3D) stacked memory (DRAMs) on top of the logic die hosting the memory controller.

Configurations herein are based, in part, on the observation that conventional approaches to memory access employ a plurality of DRAM-sided queues, or FIFOs, for synchronizing memory access according to a synchronizing clock. Results of a memory access traverse the FIFOs according to timing impulses, or strobes, that initiate a transfer of the fetched values across a memory access bus. In particular, conventional DRAMs use READ and optional WRITE FIFOs to synchronize the outgoing/incoming data to the external command clock edge. The clock domains they help to cross are a forwarded PBOX (memory box) clock from memory controller and the DRAM array. On the memory controller side there is an additional clock domain crossing FIFO scheme allowing data crossing from a PBOX (memory box) clock domain to MBOX (memory controller) clock domain. The FIFOs help accommodate latency delays across the memory bus due to signal propagation delays, since a large DRAM array having many modules may experience varying latencies depending on the fetched location in the DRAM array.

Certain memory modules, such as cache memory modules, reside in a so-called "close proximity" arrangement. Close proximity mitigates some of the latency delays between the memory controller and the DRAM modules (or other memory). Since cache memory is generally directed to faster access as opposed to main memory or mass storage (i.e. disk access), a close proximity arrangement benefits cache operation.

Unfortunately, conventional approaches to memory access suffer from the shortcoming that typical memory bus access employs a FIFO on a DRAM (memory) side of the bus and another FIFO on the controller side, each maintaining a separate clock domain transition that must be synchronized to ensure proper ordering to memory accesses.

Thus, conventional DRAMs employ READ (and optional WRITE) FIFOs to synchronize the outgoing/incoming data to the external commend clock edge. The clock domains they help to cross are the forwarded PBOX clock from memory controller and the DRAM array. On the memory controller side there is an additional clock domain crossing FIFO scheme allowing data crossing from PBOX (memory box) clock domain to MBOX (memory controller) clock domain.

The two clock domain crossing FIFO stages cause latency and complexity increases leading to a higher power and area consumption. This scheme makes sense in conventional multi-drop, multi rank/slot package to package memory interfaces. But it becomes redundant in close proximity DRAM interfaces such as direct 3D stacked DRAMs on top of the logic die hosting the memory controller. However, memory architectures such as TSVs (Through Silicon Via) provides a capability to stack individual chips on top of each other thereby reducing the footprint required for the module. The direct stacked arrangement, the DRAM modules are actually configured on top of the processor/controller arrangement they serve, thus mitigating many of the latency issues of a conventional memory bus arrangement for accessing a considerable larger bank of main DRAM memory.

Accordingly, configurations herein substantially overcome the above described shortcoming of multiple (memory side and controller side) FIFOs. The disclosed approach eliminates the DRAM internal FIFO and latency scheme, resulting in just the memory controller internal clock domain crossing FIFOs. In the particular arrangement shown, the clocking transition is simply the transition from the DRAM array timing (clock) to the memory controller MBOX-clock. Due to the timing predictability of the close proximity arrangement and the point to point nature of the bus with not having colliding DRAM traffic at the same bus, the memory side FIFO is not needed and memory access may rely on the controller side FIFO and corresponding clock for the cache memory maintaining a point to point association between DQs (data lines) to DRAM modules.

Configurations herein, therefore, split the address bus into RAS (Row) and CAS (Column) addresses to enable ideally parallel row and column decoding in conjunction with their respective strobes which will provide the advantage of reduction in access latency as well as power consumption due to less complexity compared to pipelined DRAM decoding architectures.

Close proximity between memory controller and DRAM enables wide and slow DQ (Data Line bus) interfaces instead of package to package narrow and fast DQ interfaces require higher IO clocking speeds with a cleaner forwarded clock from the memory controller to maintain the same interface bandwidth. Close proximity allows taking the MBOX clock directly reducing the clocking overhead/power consumption of the memory subsystem. Another advantage is that numerous DQ IOs reduce a need for serialization of fetched data from DRAM array at the DRAM and memory controller side. The proposed approach avoids serialization, which is also the purpose of the DRAM internal FIFO scheme. One feature is that more DQ IOs can be easier applied in TSV direct stacked 3D memory environments making this scheme possible.

The disclosed novel clocking scheme has a latency and power advantages over current DRAM standards which are optimized for package to package multi-drop DRAM interfaces. The proposed clocking scheme leverages the advantage of close proximity between DRAM array and logic by removing measures in conventional DRAM technologies aiming to provide better signal quality in noisy, longer distance environment.

To lower power consumption and easier transition to power saving modes the proposed clocking scheme envisions no free running forwarded clock from host logic host to DRAM for DRAM internal state machine. The invention proposes a ROW-ADD strobe and a COL-ADD strobe. This scheme allows a clock less DRAM-sided state machine.

Features of the disclosed clocking scheme include elimination of READ/WRITE FIFOs on DRAM side to align outgoing/incoming data to incoming clocks/strobes, no serialization between DRAM array data width and outgoing data width, and unidirectional strobes whereby the read strobe is generated at the primary SenseAmp-strip from where data is fetched from DRAM array segment. With respect to clocking, address selection is captured by assigned strobes to allow latching data internally, such that row addresses and column addresses have their own lanes and capture strobes. The DRAM state machine makes use of rising strobe edge and if necessary of falling strobe edge to process command and address decoding In a particular configuration, the disclosed approach teaches a method of accessing memory by positioning a memory component (such as a DRAM) in close proximity to a corresponding controller, and issuing a read request from the controller to the memory component, such that the read request traverses a memory interface between the controller and the memory component, in which the memory interface has a memory side and a controller side. The memory interface transfers results of the read request to the interface via a clockless state machine at the memory component, such that the clockless state machine avoids serialization on the memory side of the interface, and retrieves the results into a queue at the controller side of the memory interface directly from the memory component without the need for a DRAM side FIFO.

FIG. 1 is a context diagram of a computing environment generally including a display, keyboard, mass storage and other peripherals such as Internet connections, printers and the like, suitable for use with configurations herein. Referring to FIG. 1, in a 3D stacked memory environment 100, a processor 102 communicates with main memory 104 via a controller 112 and main memory interface 141, often referred to as a bus. In configurations herein, however, a cache interface 140 defines the close proximity, point-to-point association between the controller and the DRAM 110 dies in the DRAM stack 110-1 . . . 110-3. A cache memory 108 therefore includes memory components 110-1 . . . 110-3 (110 generally), which in the disclosed configuration are DRAM die slices. In this configuration, therefore, the memory component 110 is DRAM cache memory for responding to retrieval requests of recently requested memory pages. While ordinary memory accesses occur between the main memory 104 and the processor 102 via the controller 112, cache accesses invoke the controller 112 for access to the 3D stacked DRAMs 108, employing a memory side 142 and a controller side 144 of the interface 140, as discussed further below. Alternatively, the 3D stacked DRAMs 108 may employ a separate interface, or bus, from main memory 104.

Figure 2:
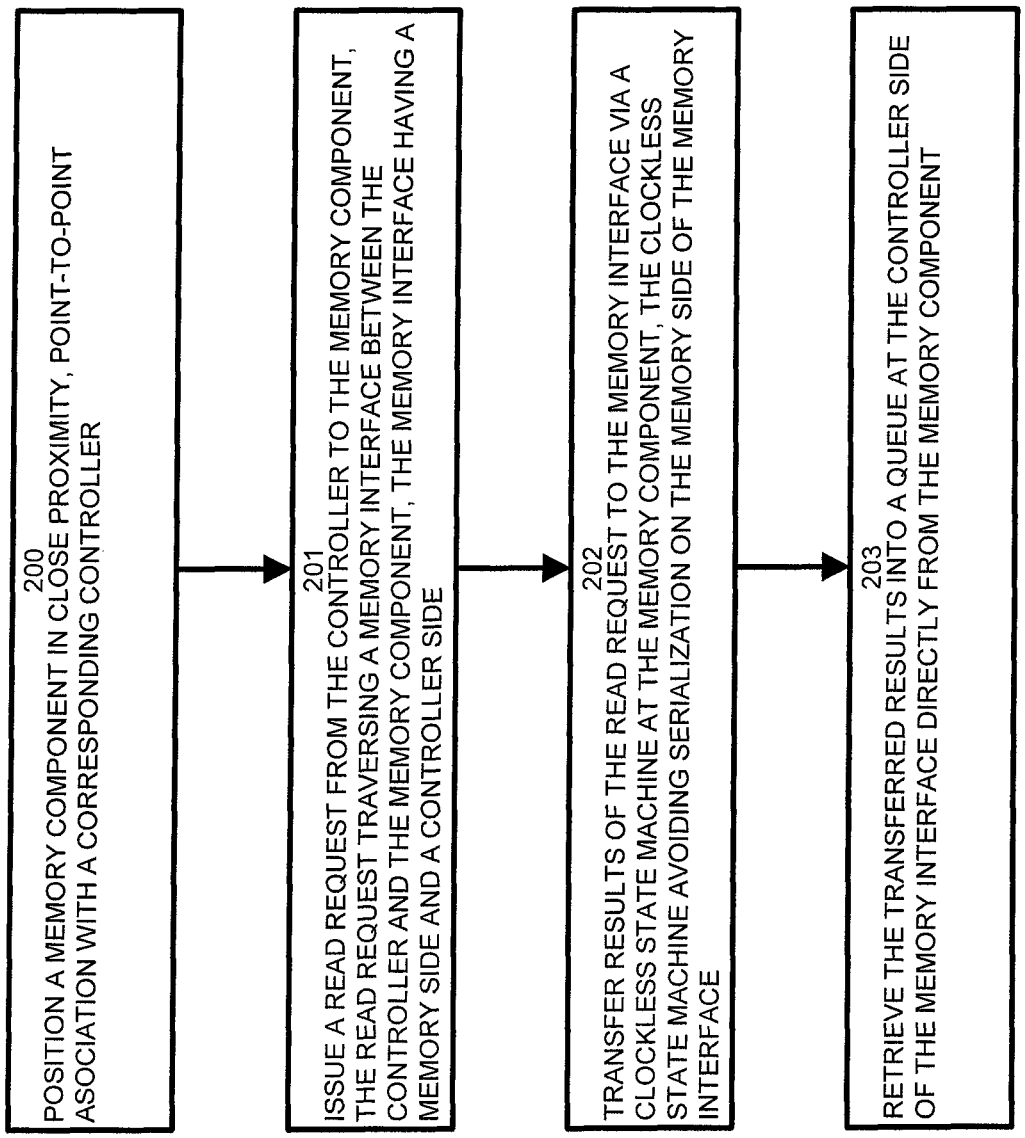
FIG. 2 is a flowchart of memory operations in the environment of FIG. 1.

FIG. 2 is a flowchart of memory operations in the environment of FIG. 1. Referring to FIGS. 1 and 2, the method of accessing memory as disclosed herein includes, at step 200, positioning a memory component 110 in close proximity to a corresponding controller 112. This may be referred to as a 3D stacked memory arrangement, in which the interface 140 is a close proximity DQ (data) point to point DRAM interface and the memory component 110 further comprises at least one DRAM die direct stacked on a logic die hosting the memory controller, such that close proximity is established by a 3D stacked arrangement of DRAM modules, or memory components 110-N.

The controller 112, responsive to the processor 102, issues a read request from the controller 112 to the memory component 110, such that the read request traverses a memory interface 140 between the controller 112 and the memory component 110, in which the memory interface has a memory side 142-1 . . . 142-3 (corresponding to DRAMs 110-1 . . . 110-3) and a controller side 144, as depicted at step 201. The memory component 110 transfers results of the read request to the interface 140 via a clockless state machine at the memory component 110, such that the clockless state machine avoids serialization on the memory side of the interface, as depicted at step 202. The controller 112 retrieves the results into a queue (FIFO) 170 at the controller side 144 of the memory interface 140 directly from the memory component 110. In the example configuration, therefore the queue is a FIFO 170 on the controller side 144 of the interface, the controller FIFO adapted to receive results directly from the memory component 110 such that a memory side FIFO is unnecessary.

Figure 3:
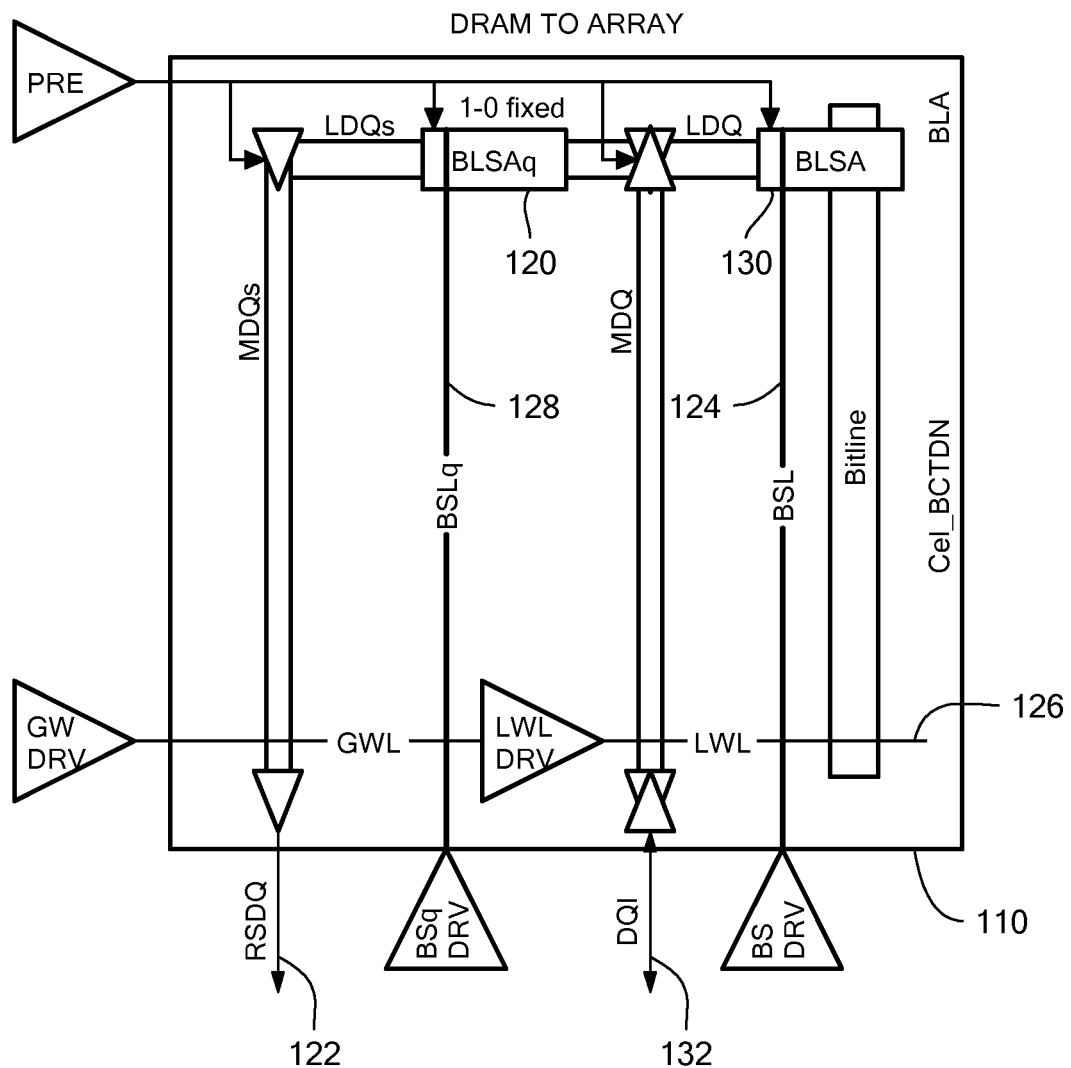
FIG. 3 is a diagram of strobe generation in the environment of FIG. 1.
Figure 4:
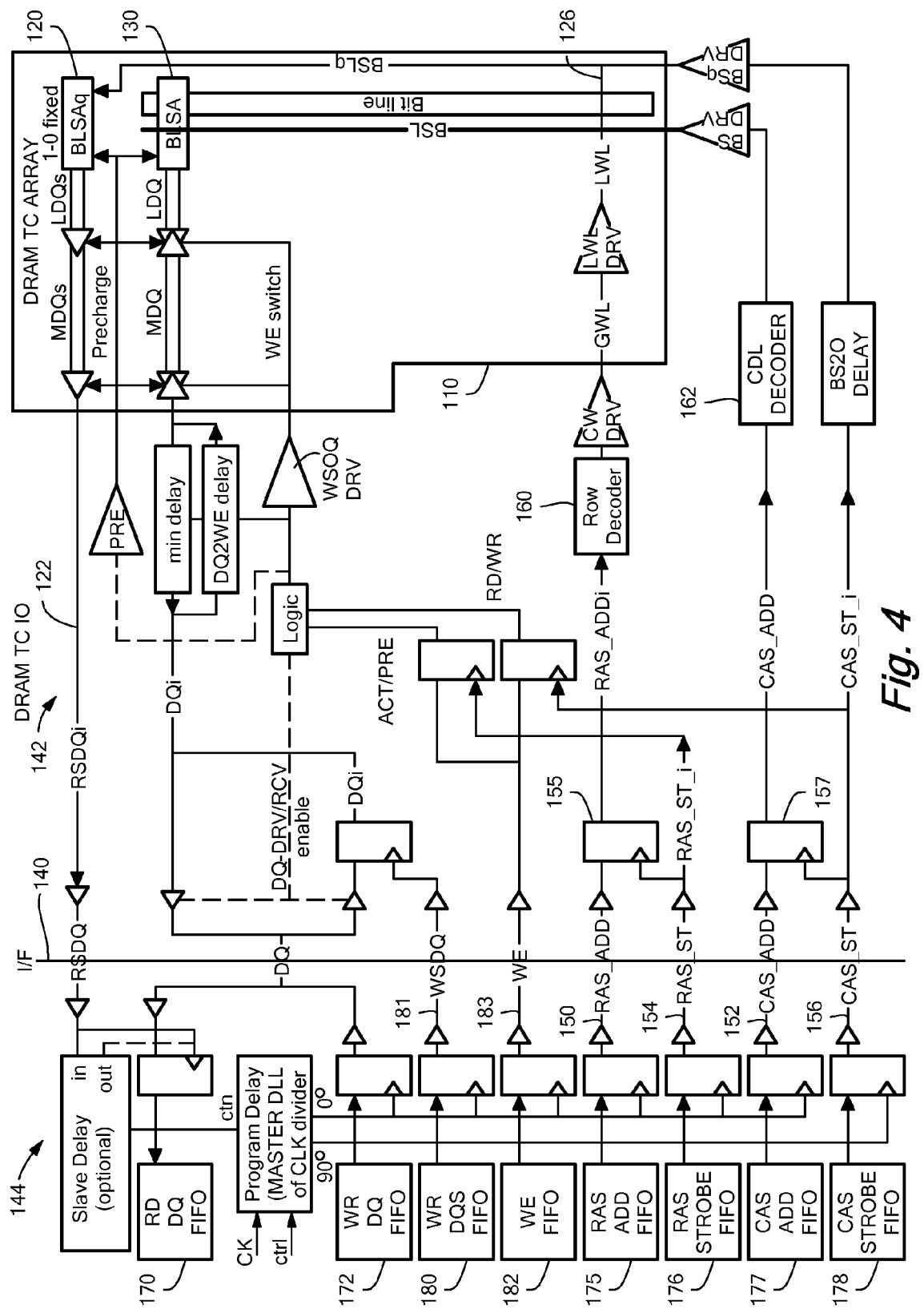
FIG. 4 is a schematic of the interface between the memory controller and DRAM sides of the interface using the strobe of FIG. 3.

FIG. 3 is a diagram of READ strobe generation in the environment of FIG. 1. Referring to FIGS. 1 and 3, the dedicated bitline sense-amp BTSAq 120 generates the DRAM sided read strobe 122 in a memory component 110 (e.g. DRAM module). The BLSAq 120 is located at the same primary SenseAmp strip where the data is fetched from the DRAM array. In FIG. 3 bitline sense-amp BSLA 130 represents one of the data sense-amps being selected by a column address at the same sense-amp stripe as BTSAq 120. A column access sets the column address lines 124 for read, after a row was activated by global word line GWL and local word line LWL 126 specifies the row address. A read pulse 122 is generated from bitline sense-amp BTSAq 120 at the same time as the data was selected by column access line 124 making data traveling along local data line LDQ and master data line MDQ is initiated. This scheme makes the read pulse traveling with the selected data traveling the same path experiencing the same technology environment. Generally, the sequence of commands for a fetch includes an activation of a DRAM page where the memory resides, a column access and a read. One particular advantage is that the strobe will travel the same way as the data back to the data IO (DQ) 141 and will have ideal tracking with the data paths across the internal interface 142 (FIG. 4). The disclosed approach provides that the read strobe 122 will travel the same way as the data back to the data IO and will have ideal tracking with the data paths across the interface 142. An ordering of the retrieval results is therefore provided by a single clock domain and corresponding retrieval queue 170 at the controller side 144 of the interface 140, in which the memory component 110 is responsive to at least one strobe for initiating the retrieval, discussed further below in FIG. 4.

FIG. 4 is a schematic of the interface between the memory controller and DRAM sides of the interface using the strobe of FIG. 3. Referring to FIGS. 1, 3 and 4, a memory interface 140 142 defines a DRAM, or memory side 142 and a logic, or controller side 144. As discussed above, a RAS_ADD line 150 carries the row address, and a CAS_ADD line 152 has the column address. The RAS_ADD 150 is responsive to a row address strobe 154 (RAS_ST) for triggering a latch 155 and the CAS_ADD 152 is responsive to a column address strobe 156 (CAS_ST) for triggering latch 157. A row decoder 160 and a column decoder 162 receive the row and column addresses, respectively. FIFOs for row, row strobe, column, and column strobe 175, 176, 177, and 178 respectively initiate the address and strobes lines. A write data line strobe FIFO 180 initiates a write data line strobe 181, and a write enable FIFO 182 initiates a write enable. A data line read FIFO 170 and a data line write FIFO 172 moderates the point-to-point association between DQs, or data lines to the DRAM dies 110.

The controller 112 issues a row address strobe (RAS) 154 and column address strobe (CAS) 156 to the memory component 110, such that the RAS 154 and CAS 156 provide synchronization of the retrieved result. The memory side of the interface 142 therefore defines a point-to-point interface 140 coupling each data line of the DQ bus to one DRAM module 110 such that latency is minimized and the RAS 154 and CAS 156 maintain synchronization for retrieved results into the queue 170 at the controller side 144 of the memory interface 140. Point to point and properly timed RAS strobe 154 and CAS strobe 156 allows FIFO queuing of memory retrievals at the memory (DRAM) side 142 of the memory interface 140.

The memory component 110 therefore defines a DRAM state machine responsive to a rising strobe edge of the at least one strobe, such that the strobe provides internal DRAM latching. In the example configuration, therefore, the queue 170 is a memory controller FIFO and retrieving the results comprises clocking employing only a memory controller clock, and the FIFO receiving results is synchronized by the memory controller clock.

Although the disclosed approach is discussed in terms of an example memory read, or fetch, the proposed clocking scheme and elimination of the memory side FIFO may also be employed in a write context.

Those skilled in the art should readily appreciate that the programs and methods defined herein are deliverable to a computer processing and rendering device in many forms, including but not limited to a) information permanently stored on non-writeable storage media such as ROM devices, b) information alterably stored on writeable non-transitory storage media such as floppy disks, magnetic tapes, CDs, RAM devices, and other magnetic and optical media, or c) information conveyed to a computer through communication media, as in an electronic network such as the Internet or telephone modem lines. The operations and methods may be implemented in a software executable object or as a set of encoded instructions for execution by a processor responsive to the instructions. Alternatively, the operations and methods disclosed herein may be embodied in whole or in part using hardware components, such as Application Specific Integrated Circuits (ASICs), Field Programmable Gate Arrays (FPGAs), state machines, controllers or other hardware components or devices, or a combination of hardware, software, and firmware components.

While the system and methods defined herein have been particularly shown and described with references to embodiments thereof, it will be understood by those skilled in the art that various changes in form and details may be made therein without departing from the scope of the invention encompassed by the appended claims.

What is claimed is:

1. A method of accessing memory comprising:
positioning a memory component in close proximity and in point to point connection to a corresponding controller;
issuing a read request from the controller to the memory component, the read request traversing a memory interface between the controller and the memory component, the memory interface having a memory side and a controller side;
transferring results of the read request to the memory interface via a clockless state machine at the memory component, the clockless state machine avoiding serialization on the memory side of the memory interface; and
retrieving the transferred results into a FIFO queue at the controller side of the memory interface, the controller FIFO adapted to receive results directly from the memory component.

2. The method of claim 1 wherein an ordering of the retrieval results is provided by a single clock domain and corresponding retrieval queue at the controller side of the interface, the memory component responsive to at least one strobe for initiating the retrieval.

3. The method of claim 2 further comprising issuing a row address strobe (RAS) and column address strobe (CAS) from the controller to the memory component, the RAS and CAS providing synchronization of the retrieved result.

4. The method of claim 3 wherein the memory interface defines a point-to-point interface coupling each data line of a DQ bus to one DRAM module such that latency is minimized and the RAS and CAS maintain synchronization for retrieved results into the queue at the controller side of the memory interface.

5. The method of claim 3 wherein the CAS strobe and RAS strobe avoids FIFO queuing of memory retrievals at the DRAM side of the memory access.

6. The method of claim 2 wherein the memory interface is a close proximity DRAM interface and the memory component further comprises at least one DRAM module direct stacked on a logic die hosting the memory controller, such that close proximity is established by a stacked arrangement of DRAM modules.

7. The method of claim 6 wherein the memory component further comprises a DRAM state machine responsive to a rising strobe edge of the at least one strobe, the strobe providing internal DRAM latching.

8. The method of claim 7 wherein the memory component is DRAM cache memory for responding to retrieval requests of recently requested memory pages.

9. The method of claim 1 wherein the queue is a memory controller FIFO and retrieving the results comprises clocking employing only a memory controller clock, the FIFO receiving results synchronized by the memory controller clock.

10. A memory access controller device, comprising:
a controller for accessing a memory component;
a memory interface to the memory component in close proximity to the controller;
at least one strobe for issuing a memory request, the memory request traversing the memory interface between the controller and the memory component, the memory interface having a memory side and a controller side, the memory component responsive to the strobes;
a data line for transferring results of the read request to the memory interface via a clockless state machine at the memory component, the clockless state machine avoiding serialization on the memory side of the interface; and
a FIFO queue at the controller side of the memory interface responsive to the retrieved results, the controller FIFO adapted to receive results directly from the memory component.

11. The device of claim 10 wherein an ordering of the retrieved results is provided by a single clock domain and corresponding retrieval queue at the controller side of the interface, the memory component responsive to at least one strobe for initiating the retrieval.

12. The device of claim 11 wherein the strobes include a row address strobe (RAS) and column address strobe (CAS) from the controller to the memory component, the RAS and CAS providing synchronization of the retrieved result.

13. The device of claim 12 wherein the memory interface defines a point-to-point interface coupling each data line of a DQ bus to one DRAM module such that latency is minimized and the RAS and CAS maintain synchronization for retrieved results into the queue at the controller side of the memory interface.

14. The device of claim 12 wherein the CAS strobe and RAS strobe avoids FIFO queuing of memory retrievals at the DRAM side of the memory access.

15. The device of claim 11 wherein the interface is a close proximity DRAM interface and the memory component further comprises at least one DRAM module direct stacked on a logic die hosting the memory controller, such that close proximity is established by a stacked arrangement of DRAM modules.

16. The device of claim 15 wherein the memory component further comprises a DRAM state machine responsive to a rising strobe edge of the at least one strobe, the strobe providing internal DRAM latching.

17. The device of claim 10 wherein the queue is a memory controller FIFO and retrieving the results comprises clocking employing only a memory controller clock, the FIFO receiving results synchronized by the memory controller clock.

18. A stacked DRAM cache memory, comprising:
a controller for accessing a memory component including at least one DRAM of the stacked cache memory;
a close proximity interface to the DRAM from the controller, the interface having a controller side and a DRAM side;
a row address strobe (RAS) and column address strobe (CAS) from the controller side to the DRAM, the RAS and CAS providing synchronization of the retrieved result; and
a FIFO on the controller side of the interface, the FIFO adapted to receive results directly from the DRAM,
the close proximity interface defining a point-to-point interface coupling each data line of a DQ bus to one DRAM module such that latency is minimized and the RAS and CAS maintain synchronization for retrieved results into the FIFO at the controller side of the interface.

* * * * *